(12) United States Patent
Hoya et al.

(10) Patent No.: US 7,161,202 B2
(45) Date of Patent: Jan. 9, 2007

(54) SEMICONDUCTOR MEMORY DEVICE AND METHOD OF READING DATA

(75) Inventors: Katsuhiko Hoya, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 114 days.

(21) Appl. No.: 10/738,999

(22) Filed: Dec. 19, 2003

(65) Prior Publication Data
US 2005/0067645 A1 Mar. 31, 2005

(30) Foreign Application Priority Data
Sep. 29, 2003 (JP) ............................. 2003-338159

(51) Int. Cl.
*H01L 29/76* (2006.01)
*H01L 29/94* (2006.01)
*H01L 31/119* (2006.01)

(52) U.S. Cl. .................. 257/296; 257/295; 257/310

(58) Field of Classification Search ........ 257/295–296, 257/310
See application file for complete search history.

(56) References Cited

U.S. PATENT DOCUMENTS 6,611,015 B1 *  8/2003  Ozaki et al. ................ 257/296

FOREIGN PATENT DOCUMENTS

JP  10-255483  9/1998
JP  11-177036  7/1999

OTHER PUBLICATIONS

D. Takashima, et al., "High-Density Chain Ferroelectric Random-Access Memory (CFRAM)", 1997 Symposium on VLSI Circuits Digest of Technical Papers, pp. 83-84, 1997.

* cited by examiner

*Primary Examiner*—Chuong Anh Luu
(74) *Attorney, Agent, or Firm*—Oblon, Spivak, McClelland, Maier & Neustadt, P.C.

(57) ABSTRACT

First and second ferroelectric capacitors are selectively connected with a first bit line. Data is read to the first bit line from a first ferroelectric capacitor by applying a first voltage in a coordinate increasing direction of an axis or from the second ferroelectric capacitor by applying a second voltage having a sign opposite to the first voltage in the coordinate increasing direction. Third and fourth ferroelectric capacitors are selectively connected with a second bit line. Data is read to the second bit line from the third ferroelectric capacitor by applying a third voltage having the same sign as the first voltage in the coordinate increasing direction or from the fourth ferroelectric capacitor by applying a fourth voltage having the same sign as the second voltage in the coordinate increasing direction. A sense amplifier amplifies the potential difference between the first and second bit lines.

30 Claims, 11 Drawing Sheets

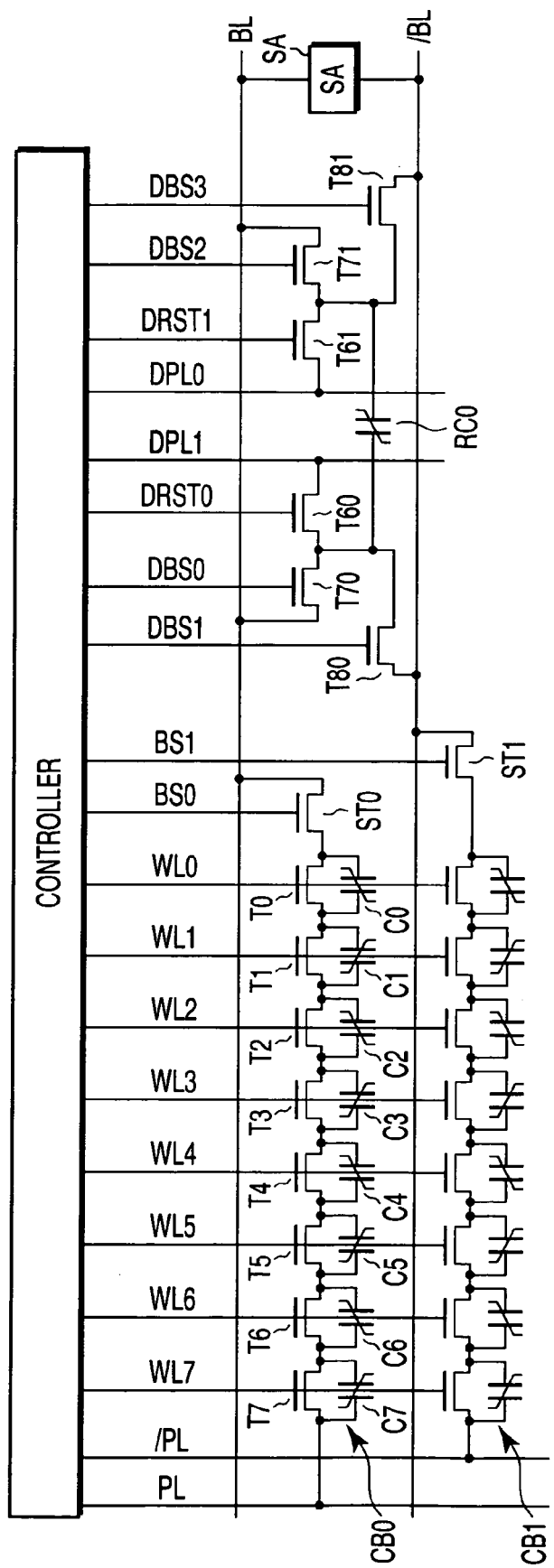
F I G. 10

SEMICONDUCTOR MEMORY DEVICE AND METHOD OF READING DATA

CROSS-REFERENCE TO RELATED APPLICATIONS

This application is based upon and claims the benefit of priority from the prior Japanese Patent Application No. 2003-338159, filed Sep. 29, 2003, the entire contents of which are incorporated herein by reference.

BACKGROUND OF THE INVENTION

1. Field of the Invention

The present invention relates to a semiconductor memory device, in particular, to a semiconductor memory device using ferroelectric materials as its memory cells.

2. Description of the Related Art

As can be seen from FIG. 12, ferroelectric materials take two charge (polarization) quantity (Q) states (basic points A, D) when application voltage Vf is zero. This is because the spontaneous polarization has a hysteresis characteristic. These two states correspond to a binary condition. In this way, a semiconductor memory device using ferroelectric materials as its memory cells (hereinafter, referred to as a ferroelectric memory) can store binary data when the power supply is switched off. Each memory cell comprises a ferroelectric capacitor having a structure in which a ferroelectric film is interposed between two electrodes. One electrode is connected to a bit line; the other, to a plate line for generating a voltage between bit lines.

When data is read, for example, a voltage −VINT is applied to the ferroelectric film. As a result, the states of the ferroelectric film individually transfer to operating points B and C at which the hysteresis curve intersects straight line L1 or L2. The straight line L1 or L2 corresponds to the capacitance of the bit line (capacitor connected to bit line and the sum of parasitic capacitance). Thus, voltages corresponding to the operating points B and C are applied to the bit line. The following reference potential is prepared independently. More specifically, the reference potential is the intermediate between potentials VH and VL at operating points B and C using the potential −VINT as the basis. The reference potential and the potentials VH and VL are compared and amplified. The reference potential can be generated by properly setting an operating point P using a ferroelectric capacitor. In this case, a ferroelectric capacitor having a hysteresis characteristic such that the operating point P is properly positioned is used.

In the foregoing description, the voltage −VINT is used; therefore, the operating points B and C transfer in a negative region of the Y-axis (negative operating region). The ferroelectric capacitor for memory and reference voltage generation operates in the same operating region. However, depending on the configuration of the ferroelectric memory, positive and negative voltages are both used by several ferroelectric capacitors. When a voltage +VINT is used, operating points E and F transfer in a positive region of the Y-axis (positive operating region), and a potential set the potential +VINT as the basis is used. In such a ferroelectric memory, potential absolute value obtained from the potential +VINT or −VINT is used, and thereby, data can be read according to the same method regardless of positive and negative operating regions.

FIG. 13 shows a typical example of memory cells using both positive and negative voltages when reading data from a ferroelectric capacitor. FIG. 14 is a circuit diagram showing parts shown in FIG. 13 and its peripheral parts. FIG. 15 is a timing chart to explain the operation of FIG. 14.

As shown in FIG. 14 and FIG. 15, transistors T0 to T7 are powered on in the standby mode. In other words, no voltage is applied to memory capacitors C0 to C7. For example, when data is read from the memory capacitor C0, bit lines BL are /BL are in a floating state. The transistor T0 is powered off while a cell block select transistor ST0 is powered on. In this state, a plate line PL is set to a drive potential VINT, and thereby, the data of the capacitor C0 is read to the bit line BL. Simultaneously, a block select transistor BST is powered on, and a dummy plate line DPL is set to a drive potential VINT. By doing so, a reference potential is read from a reference potential capacitor RC to the bit line /BL.

When data is read from the memory capacitor C0, only transistor T0 is powered off. Thus, as seen from FIG. 13, the top electrode of the memory capacitor C0 is connected to the bit line BL while the bottom electrode thereof is connected to the plate line PL via transistors T1 to T6. Therefore, voltage is applied from the bottom electrode of the memory capacitor C0 toward the top electrode thereof. The same operation as above is carried out in memory capacitors C2, C4 and C6.

On the other hand, when data is read from the memory capacitor C1, only transistor T1 is powered off. Therefore, the bottom electrode of the memory capacitor C1 is connected to the bit line BL via the transistor T0 while the top electrode thereof is connected to the plate line PL via transistors T2 to T7. Thus, voltage is applied from the bottom electrode of the capacitor C1 toward the top electrode thereof, that is, in the direction opposite to that is the case of the memory capacitor C0. The same operation as above is carried out in memory capacitors C3, C5 and C7.

Incidentally, the same directional voltage is always applied to the reference potential capacitor RC. In other words, the reference potential capacitor RC always operates in either the positive or negative region. Even if the memory capacitors C0 to C7 take positive and negative operating regions, the reference potential is set to be positioned at the approximately intermediate potential between read potentials VH and VL in either the positive or negative region. The absolute value of the reference potential is used in the positive and negative operating regions. The hysteresis characteristic of the ferroelectric capacitor is symmetrical with respect to the Y-axis. Therefore, memory cell capacitors C0 to C7 operate in the same manner regardless of the operating region.

The hysteresis characteristic of FIG. 12 may be distorted as shown in FIG. 16 depending on conditions when forming the ferroelectric capacitor (initial imprint). As a result, the hysteresis characteristic becomes non-symmetrical with respect to the Y-axis. Incidentally, memory capacitors C0 to C7 and reference potential capacitor RC all have nearly the same hysteresis characteristic because of having substantially the same configuration. If the hysteresis characteristic becomes non-symmetrical, the absolute value of the potential at the operating point is different depending on whether the capacitor is operated and in which region it is operated.

As described above, the memory capacitors C0 to C7 take both positive and negative operating regions. However, the operating point of the reference potential capacitor RC is set to a proper position in one of the positive and negative region (e.g., negative region). Thus, if the memory capacitors C0 to C7 operate in the other region (e.g., positive region), the operating point of the reference potential capacitor RC is largely shifted from the intermediate point between operating points E and F of the memory capacitors C0 to C7. As a result, the data read margin is reduced.

BRIEF SUMMARY OF THE INVENTION

According to a first aspect of the present invention, there is provided a semiconductor memory device comprising: a first bit line and a second bit line constituting a bit line pair; a first ferroelectric capacitor from which data is read to the first bit line by applying a first voltage in a coordinate increasing direction of an axis to the first ferroelectric capacitor with which the first bit line is selectively and electrically connected; a second ferroelectric capacitor from which data is read to the first bit line by applying a second voltage having a sign opposite to the first voltage in the coordinate increasing direction to the second ferroelectric capacitor with which the first bit line is selectively electrically connected; a third ferroelectric capacitor from which data is read to the second bit line by applying a third voltage having a same sign as the first voltage in the coordinate increasing direction to the third ferroelectric capacitor with which the second bit line is selectively electrically connected; a fourth ferroelectric capacitor from which data is read to the second bit line by applying a fourth voltage having a same sign as the second voltage in the coordinate increasing direction to the fourth ferroelectric capacitor with which the second bit line is selectively electrically connected; and a sense amplifier amplifying the potential difference between the first bit line and the second bit line.

According to a second aspect of the present invention, there is provided a semiconductor memory device comprising: a first bit line and a second bit line constituting a bit line pair; a first ferroelectric capacitor from which data is read to the first bit line by applying a first voltage in a coordinate increasing direction of an axis to the first ferroelectric capacitor with which the first bit line is selectively and electrically connected; a second ferroelectric capacitor from which data is read to the first bit line by applying a second voltage having a sign opposite to the first voltage in the coordinate increasing direction to the second ferroelectric capacitor with which the first bit line is selectively electrically connected; a third ferroelectric capacitor from which data is read to the second bit line by applying a third voltage having a same sign as the first voltage in the coordinate increasing direction or a fourth voltage having a sign opposite to the third voltage in the coordinate increasing direction to the third ferroelectric capacitor with which the second bit line is selectively electrically connected; and a sense amplifier amplifying the potential difference between the first and second bit lines.

According to a third aspect of the present invention, there is provided a method of reading data comprising: when reading data from a first ferroelectric film, reading data to a first bit line by applying a first voltage in a coordinate increasing direction of a first direction axis to the first ferroelectric film; reading reference potential to a second bit line by applying a third voltage having a same sign as the first voltage in the coordinate increasing direction to a third ferroelectric film; and amplifying the potential difference between the first and second bit lines, when reading data from a second ferroelectric film, reading data to the first bit line by applying a second voltage having a sign opposite to the first voltage in the coordinate increasing direction to the second ferroelectric film; reading reference potential to the second bit line by applying a fourth voltage having a same sign as the second voltage in the coordinate increasing direction to a fourth ferroelectric film; and amplifying the potential difference between the first and second bit lines.

According to a fourth aspect of the present invention, there is provided a method of reading data comprising: when reading data from a first ferroelectric film, reading data to a first bit line by applying a first voltage in a coordinate increasing direction of a first direction axis to the first ferroelectric film; reading reference potential to a second bit line by applying a third voltage having a same sign as the first voltage in the coordinate increasing direction to a third ferroelectric film; and amplifying the potential difference between the first and second bit lines, when reading data from a second ferroelectric film, reading data to the first bit line by applying a second voltage having a sign opposite to the first voltage in the coordinate increasing direction to the second ferroelectric film; reading reference potential to the second bit line by applying a fourth voltage having a same sign as the second voltage in the coordinate increasing direction to the third ferroelectric film; and amplifying the potential difference between the first and second bit lines.

BRIEF DESCRIPTION OF THE SEVERAL VIEWS OF THE DRAWING

FIG. 10 is a view schematically showing the circuit configuration of a semiconductor memory device according to a fourth embodiment of the present invention;

DETAILED DESCRIPTION OF THE INVENTION

Figure 1:
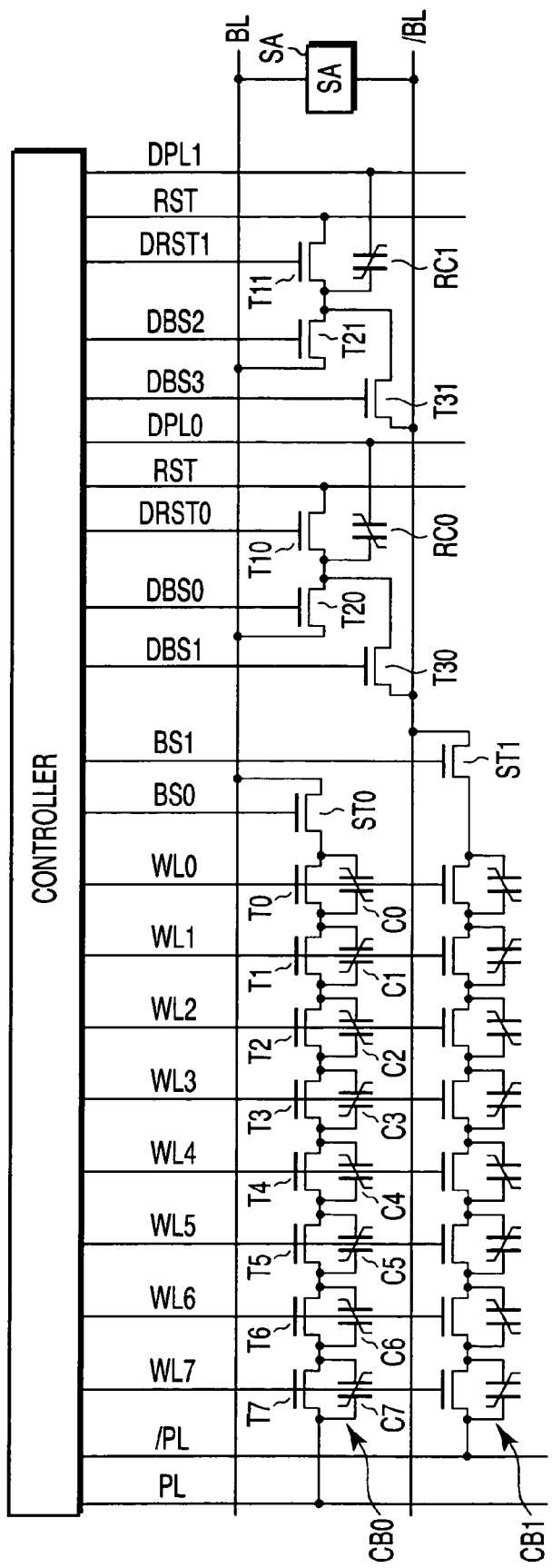
FIG. 1 is a view schematically showing the circuit configuration of a semiconductor memory device according to a first embodiment of the present invention.

Embodiments of the present invention will be described below with reference to the accompanying drawings. In the following description, the same reference numerals are given to constituent components having substantially the same function and configuration, and overlapping explanation will only be made if necessary.

FIG. 1 is a view schematically showing the circuit configuration of a semiconductor memory device according to a first embodiment of the present invention. The semiconductor memory device is a TC parallel unit series-connection type ferroelectric memory. As illustrated in FIG. 1, a unit cell comprising a memory capacitor using ferroelectric material and a transistor is series-connected, and thereby, a cell block CB0 is formed.

In each unit cell, both terminals of memory capacitors C0 to C7 are connected to those of transistors T0 to T7, respectively. Gate electrodes of transistors T0 to T7 are connected to word lines WL0 to WL7, respectively. The word lines WL0 to WL7 are connected with a controller CNT for controlling predetermined voltage application.

The terminal of the memory capacitor C7 opposite to the connection terminal of the memory capacitor C6 is connected with a plate line PL (first plate line). The plate line PL has a function of applying a voltage to memory capacitors C0 to C7. The terminal of the memory capacitor C0 opposite to the connection terminal of the memory capacitor C1 is connected with one terminal of a cell block select transistor ST0. The other terminal of the cell block select transistor ST is connected with a bit line BL (first bit line). The gate of the cell block select transistor ST0 is connected with a cell block select line BS0. The plate line PL and the cell block select line BS0 are connected with the controller CNT.

A cell block CB1 having the same configuration as the cell block CB0 is interposed between the bit line /BL and a plate line /PL. In the cell block CB1, the terminal of the memory capacitor C7 opposite to the connection terminal of the memory capacitor C6 is connected with the plate line /PL. The plate line /PL plate line PL has a function of applying a voltage to memory capacitors C0 to C7. The terminal of the memory capacitor C0 opposite to the connection terminal of the memory capacitor C1 is connected with one terminal of a cell block select transistor ST1. The other terminal of the cell block select transistor ST1 is connected with the bit line /BL. The gate of the cell block select transistor ST1 is connected with a cell block select line BS1. The plate line /PL and the cell block select line BS1 are connected with the controller CNT.

A dummy plate line DPL0 (second plate line) is connected with one terminal (sixth electrode) of a reference potential capacitor RC0 (third capacitor). The reference potential capacitor RC0 comprises ferroelectric capacitor, and is used for generating reference voltage. The other terminal (fifth electrode) of the reference potential capacitor RC0 is connected with one terminal of a reset transistor T10. The other terminal of the reset transistor T10 is connected with a reset potential line RST. A low level potential VSS is applied to the reset potential line RST from the controller CNT. The gate of the reset transistor T10 is connected with a reset signal line DRST0. The reset signal line DRST0 is connected with the controller CNT.

The other terminal of the reset transistor T10 is connected with each one terminal of block select transistors T20 and T30. The other terminals of block select transistors T20 and T30 are connected with bit lines BL and /BL (second bit line), respectively. The gates of block select transistors T20 and T30 are connected with block select lines DBS and DBS1, respectively. The block select lines DBS0 and DBS1 are connected with the controller CNT.

A dummy plate line DPL1 (third plate line) is connected with one terminal (seventh electrode) of a reference potential capacitor RC1 (fourth capacitor). The reference potential capacitor RC1 comprises ferroelectric capacitor, and is used for generating reference voltage. The other terminal (eighth electrode) of the reference potential capacitor RC1 is connected with one terminal of a reset transistor T11. The other terminal of the reset transistor T11 is connected with the reset potential line RST. The gate of the reset transistor T11 is connected with a reset signal line DRST1. The reset signal line DRST is connected with the controller CNT.

The other terminal of the reset transistor T11 is connected with each one terminal of block select transistors T21 and T31. The other terminals of block select transistors T21 and T31 are connected with bit lines BL and /BL, respectively. The gates of block select transistors T21 and T31 are connected with block select lines DBS2 and DBS3, respectively. The block select lines DBS2 and DBS3 are connected with the controller CNT. A sense amplifier SA is interposed between bit lines BL and /BL.

The following is a description on the peripheral cross-sectional structure of cell block CB1, cell block select transistor ST0, reference potential capacitors RC0 and RC1. The cell block CB1 and the cell block select transistor ST0 have the same cross-sectional structure as the conventional case. More specifically, the surface of a semiconductor substrate Sub is provided with cell block select transistor ST0 and transistors T0 to T7. The cell block select transistor ST0 and transistors T0 to T7 constitute part of a connection controller. Any of memory capacitors C0 to C7 is connected to the bit line BL and the plate line PL according to the control by the connection controller.

The cell block select transistor ST0 has source/drain diffusion layer SD0, SD1 and a gate electrode (block select line) BS0 on a gate insulating film (not shown). The source/drain diffusion layer SD0 is electrically connected to the bit line BL via contact CP0, interconnection layer M0 and connection layer CL0.

Transistors T0 to T7 are each composed of adjacent two of source/drain diffusion layers SD0 to SD9 and a gate electrode (word line) WL0 to WL7 on a gate insulating film (not shown).

Figure 13:
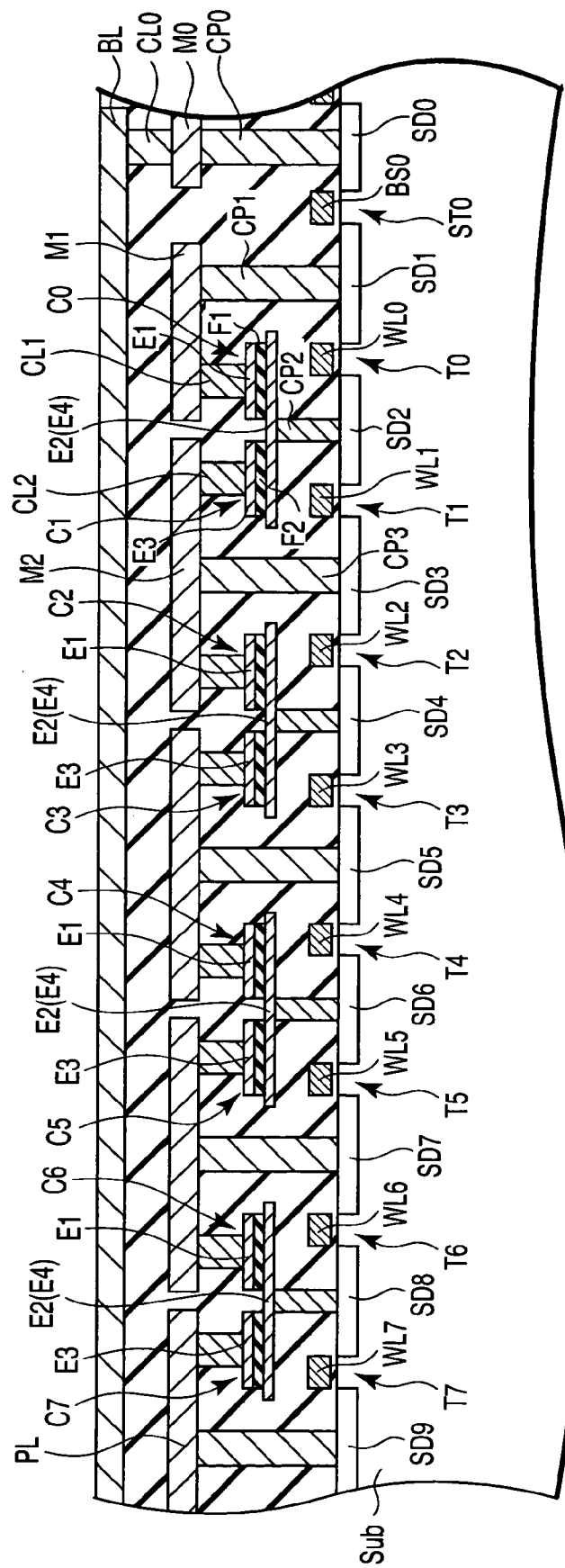
FIG. 13 is a view showing memory cells of a ferroelectric memory.

The source/drain diffusion layers SD1 is electrically connected to a first electrode E1 of the memory capacitor C0 (first capacitor) via contact CP1, interconnection layer M1 and connection layer CL1. First and second electrodes E1 and E2 of the memory capacitor C0 are provided as follows. These electrodes E1 and E2 are provided in that order to interpose a first ferroelectric film F1 between them in the coordinate increasing direction of an axis (first direction axis) along a certain first direction. The coordinate increasing direction of the first direction axis means the direction below if the semiconductor memory device is the TC parallel unit series-connection type of FIG. 13. The coordinate increasing direction is a direction from above the semiconductor substrate Sub toward it (i.e., direction from the top toward the bottom in FIG. 13). In this case, first and second electrodes E1 and E2 correspond to top and bottom electrodes, respectively. The second electrode E2 is electrically connected to the source/drain diffusion layer SD2 via contact CP2.

The source/drain diffusion layer SD2 is connected with a fourth electrode E4 of the memory capacitor C1 (second capacitor). Third and fourth electrodes E3 and E4 (common to second electrode E2) of the memory capacitor C1 are provided as follows. These third and fourth electrodes E3 and E4 are provided in that order to interpose a second ferroelectric film F2 between them in the coordinate increasing direction of the first direction axis. If the semiconductor memory device is the TC parallel unit series-connection type, third and fourth electrodes E3 and E4 correspond to top and bottom electrodes, respectively, as seen from FIG. 13. The third electrode E3 is electrically connected to the source/drain diffusion layer SD3 via connection layer CL2, interconnection layer M2 and contact CP3.

Memory capacitors C2, C4 and C6 each have the same configuration as the memory capacitor C0. First and second electrodes E1 and E2 of the memory capacitor C2 are electrically connected respectively to source/drain diffusion layers SD3 and SD4 constituting part of the transistor T2. First and second electrodes E1 and E2 of the memory capacitor C4 are electrically connected respectively to source/drain diffusion layers SD5 and SD6 constituting part of the transistor T4. First and second electrodes E1 and E2 of the memory capacitor C6 are electrically connected respectively to source/drain diffusion layers SD7 and SD8 constituting part of the transistor T6.

Memory capacitors C3, C5 and C7 each have the same configuration as the memory capacitor C1. Third and fourth electrodes E3 and E4 of the memory capacitor C3 are electrically connected respectively to source/drain diffusion layers SD5 and SD4 constituting part of the transistor T3. Third and fourth electrodes E3 and E4 of the memory capacitor C5 are electrically connected respectively to source/drain diffusion layers SD7 and SD6 constituting part of the transistor T5. Third and fourth electrodes E3 and E4 of the memory capacitor C7 are electrically connected respectively to source/drain diffusion layers SD9 and SD8 constituting part of the transistor T7.

The source/drain diffusion layer SD9 and the third electrode E3 of the memory capacitor C7 are electrically connected with the plate line PL.

Figure 2:
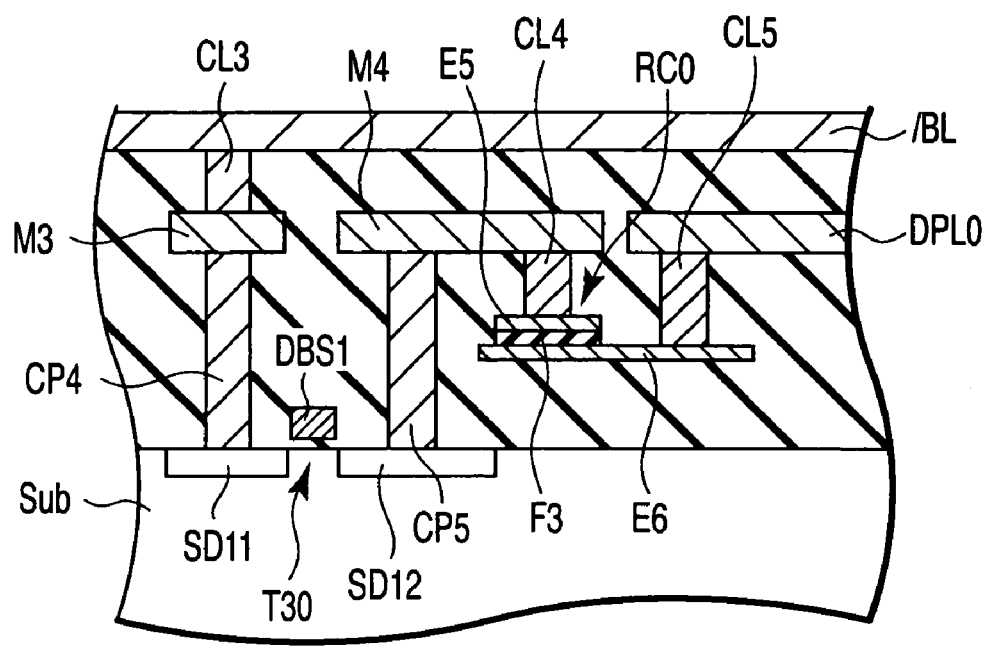
FIG. 2 is a view schematically showing the cross-sectional structure of peripheral portions of a reference potential capacitor RC0.
Figure 3:
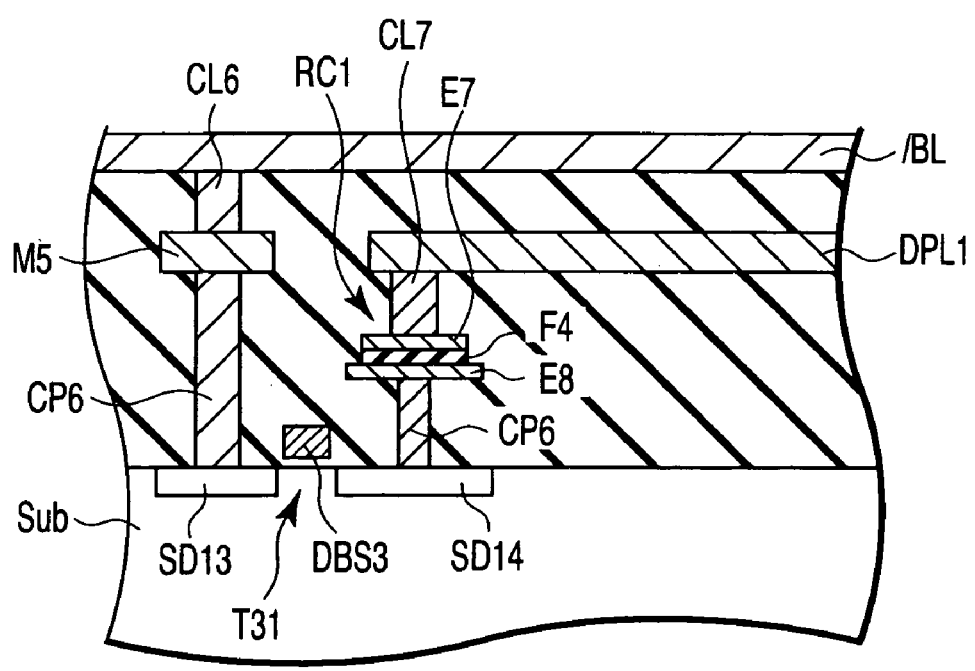
FIG. 3 is a view schematically showing the cross-sectional structure of peripheral portions of a reference potential capacitor RC1.

FIG. 2 and FIG. 3 schematically show the cross-sectional structure of reference potential capacitors RC0 and RC1, respectively. As shown in FIG. 2, the block select transistor T30 has source/drain diffusion layers SD11, SD12, and a gate electrode (block select line) DBS1 on a gate insulating film (not shown).

The bit line /BL is electrically connected with the source/drain diffusion layer SD11 via connection layer CL3, interconnection layer M3 and contact CP4. The source/drain diffusion layer SD12 is electrically connected with a fifth electrode E5 of the reference potential capacitor RC0 via contact CP5, interconnection layer M4 and connection layer CL4. Fifth and sixth electrodes E5 and E6 of the reference potential capacitor RC0 are provided in that order to interpose a third ferroelectric film F3 between them in the coordinate increasing direction of the first direction axis. If the semiconductor memory device is the TC parallel unit series-connection type, fifth and sixth electrodes E5 and E6 correspond to top and bottom electrodes, respectively, as seen from FIG. 2. The sixth electrode E6 is electrically connected to the dummy plate line DPL0 via connection layer CL5.

As illustrated in FIG. 3, the block select transistor T31 has source/drain diffusion layers SD13, SD14, and a gate electrode (block select line) DBS3 on a gate insulating film (not shown).

The bit line /BL is electrically connected with the source/drain diffusion layer SD13 via connection layer CL6, interconnection layer M5 and contact CP6. The source/drain diffusion layer SD14 is electrically connected with an eighth electrode E8 of the reference potential capacitor RC1 via the contact CP6. Seventh and eighth electrodes E7 and E8 of the reference potential capacitor RC1 are provided in that order to interpose a third ferroelectric film F4 between them in the coordinate increasing direction of the first direction axis. If the semiconductor memory device is the TC parallel unit series-connection type, seventh and eighth electrodes E7 and E8 correspond to top and bottom electrodes, respectively, as seen from FIG. 3. The seventh electrode E7 is electrically connected to the dummy plate line DPL1 via connection layer CL7.

Typically, first, third, fifth and seventh electrodes E1, E3, E5 and E7 consist of the same material in the same layer, and are formed according to the same process. Likewise, second, fourth, sixth and eighth electrodes E2, E4, E6 and E8 consist of the same material in the same layer, and are formed according to the same process. Thus, memory capacitors C0 to C7 and reference potential capacitors RC0 and RC1 all have the same hysteresis characteristic.

Figure 4:
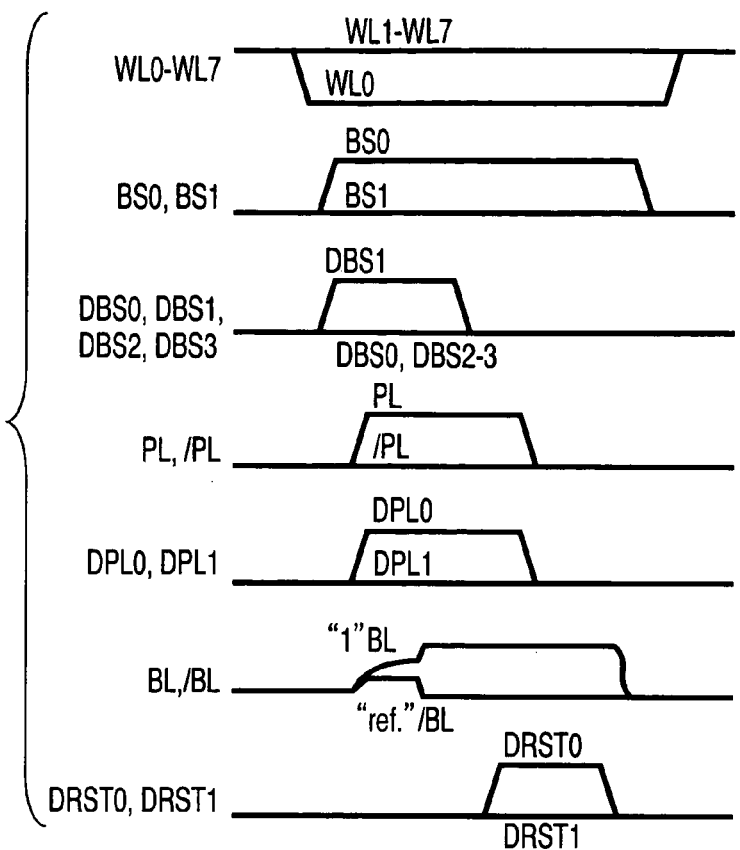
FIG. 4 is a view showing potentials of principal parts of the semiconductor memory device shown in FIG. 1.

The operation of the semiconductor memory device having the foregoing configuration will be described below. FIG. 4 shows potentials of principal parts of the semiconductor memory device of FIG. 1. Here, the case where the data of the memory capacitor C0 of the cell block CB0 is read is given as the example. Bit lines BL and /BL are set to a floating state. As depicted in FIG. 4, the word line WL0 is set to low level, and thereby, the transistor T0 is powered off. Then, the cell block select line BS0 is set to high level. As a result, the first electrode (top electrode) E1 of the memory capacitor C0 is electrically connected with the bit line BL while the second electrode (bottom electrode) E2 thereof is electrically connected with the plate line PL. The cell block select line BS1 is kept at high level.

The block select line DBS1 is set to high level, and thereby, the sixth electrode (bottom electrode) E6 is electrically connected with the dummy plate line DPL0 via the block select transistor T30. Block select lines DBS0, DBS2 and DBS3 are kept at low level.

Figure 12:
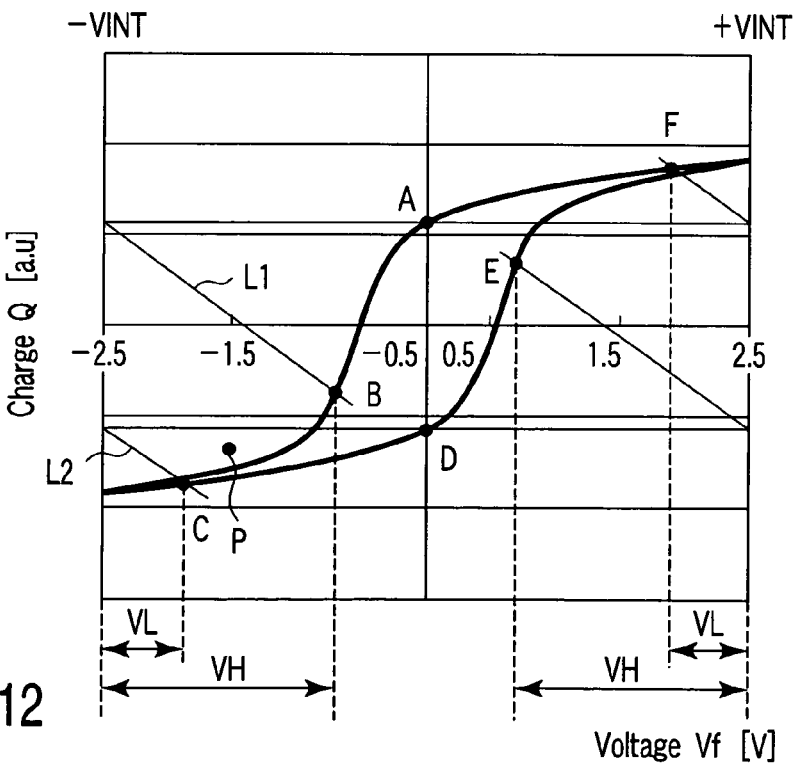
FIG. 12 is a graph showing a hysteresis characteristic of ferroelectric materials.

A drive potential VINT is applied to plate lines PL and DPL0. As a result, voltage is applied to both memory capacitor C0 and reference potential capacitor RC0 in a decreasing direction (from the bottom toward the top in FIG. 2, FIG. 12) of the first direction axis. Thus data (e.g., data "1") is read to the bit line /BL, so that reference potential ref can be read to the bit line BL. The potential difference between bit lines BL and /BL is amplified by the sense amplifier SA.

After the data read, the block select line DBS1 is set to low level, and a reset signal line DRST0 is set to high level. The dummy plate line DPL0 is set to low level while the reset signal line DRST0 is kept at high level. As a result, data for generating reference potential is written to the reference potential capacitor RC0 in accordance with the potential of the reset potential line RST. More specifically, if the reset potential line RST has potential VSS, data "0" is written to the reference potential capacitor RC0. On the other hand, if the reset potential line RST has the drive potential VINT, data "1" is written to the reference potential capacitor RC0.

When the data of the memory capacitor C1 is read (not shown), the word line WL1 is set to low level, and thereafter, the cell block select line BS0 is set to high level like the case of the memory capacitor C0. As a result, the third electrode (top electrode) E3 of the memory capacitor C1 is electrically connected with the plate line PL while the fourth electrode (bottom electrode) E4 thereof is electrically connected with the bit line BL.

The block select line DBS3 is set to high level, and thereby, the eighth electrode (bottom electrode) E8 is electrically connected with the bit line BL via the block select transistor T31. Thereafter, plate lines PL and DPL1 are driven like the case of the memory capacitor C0.

Figure 14:
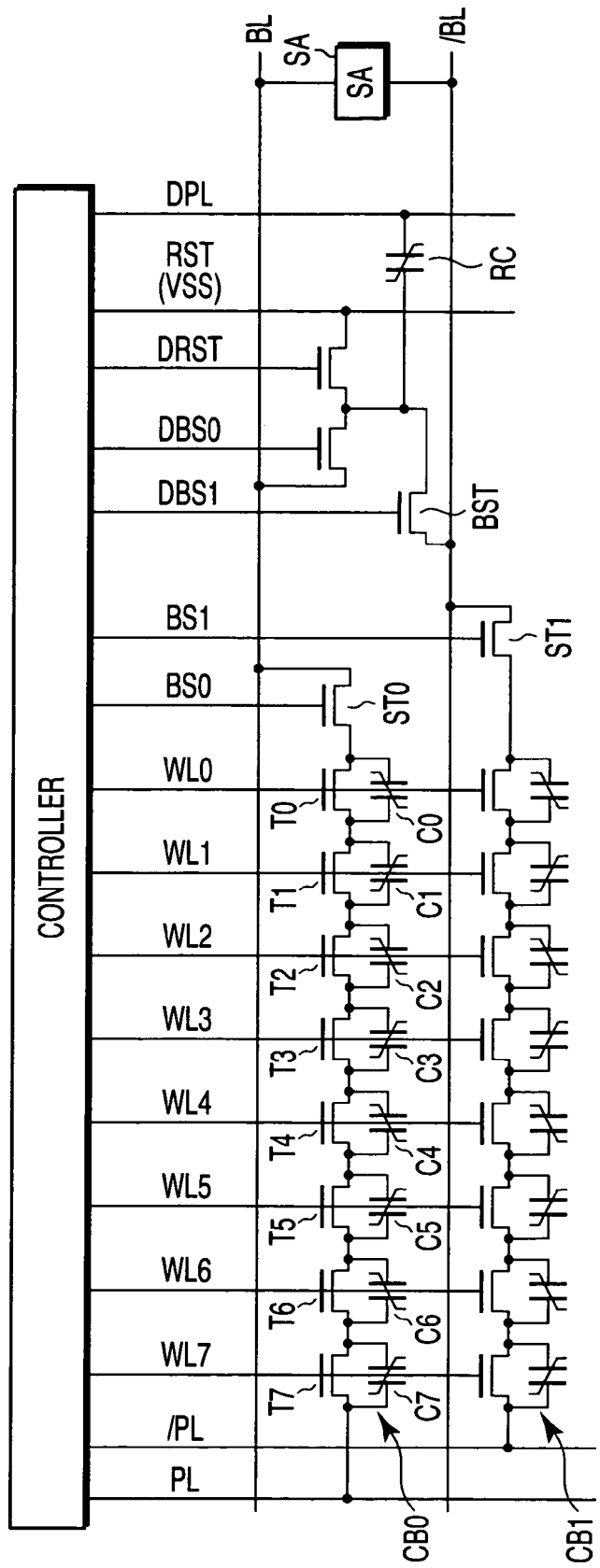
FIG. 14 is a circuit diagram including portions shown in FIG. 13.
Figure 15:
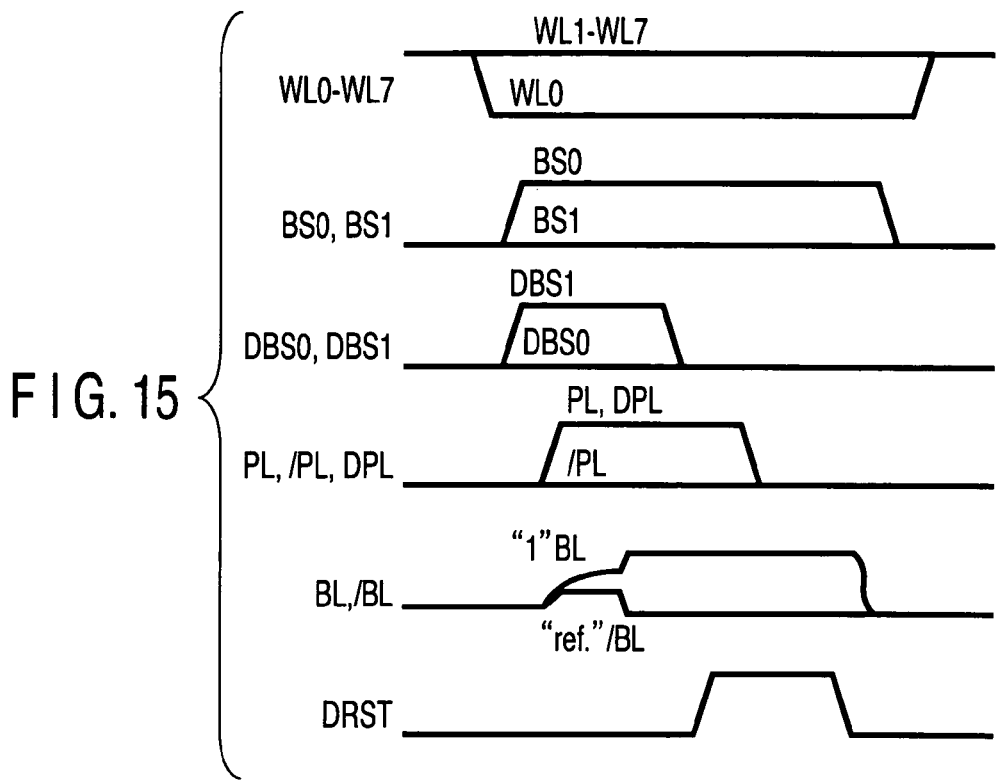
FIG. 15 is a view showing potentials of principal parts of the circuit shown in FIG. 14.
Figure 16:
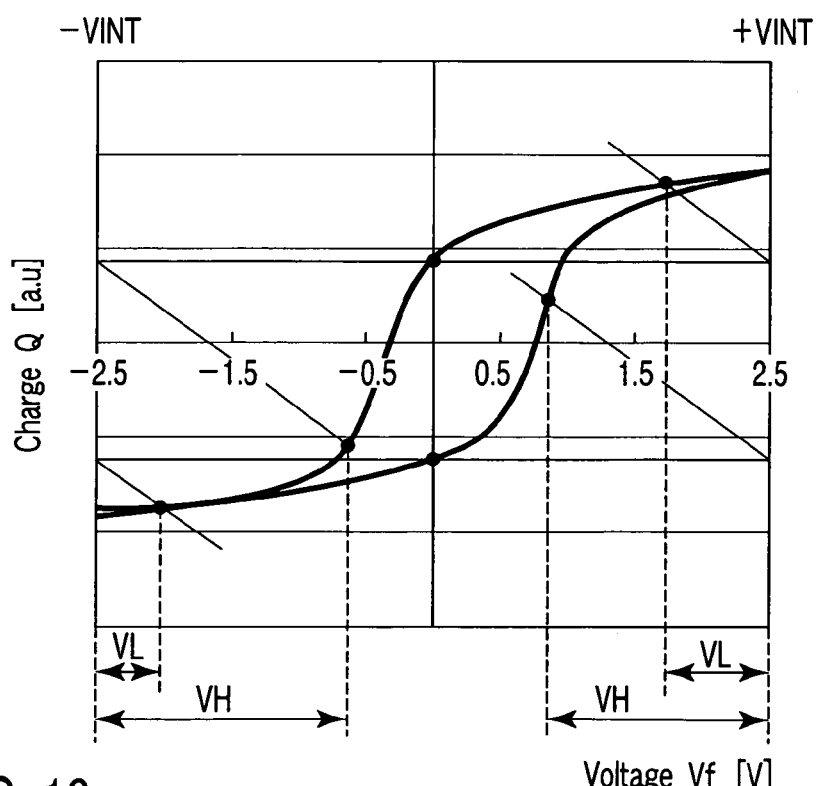
FIG. 16 is a graph showing a hysteresis characteristic having non-symmetry.

In FIG. 1 and FIG. 14, there are shown graphical symbols "_/⎯" and "⎯\_" crossing both electrodes of memory capacitors C0 to C7, reference potential capacitors RC0 and RC1. The graphical symbols show which of bit line (low potential) and plate line (high potential) is connected to the front electrode of the first direction axis in the read operation. More specifically, there is shown the graphical symbol "_/⎯" extending from the upper right to the lower left. In this case, the front electrode (first and fifth electrodes E1 and E5) of the first direction axis is connected to the low potential in the read operation. On the other hand, there is shown the graphical symbol "⎯\_" extending from the upper left to the lower right. In this case, the front electrode (third and seventh electrodes E3 and E7) of the first direction axis is connected to the high potential in the read operation.

According to the first embodiment of the present invention, the semiconductor memory device is provided with two reference potential capacitors having the same hysteresis characteristic distortion. Individual reference potential capacitors have two electrode provided along the common first direction axis. When generating reference potential, voltage is applied to one reference potential capacitor in the increasing direction of the first direction axis. In addition, voltage is applied to the other reference potential capacitor in the decreasing direction of the first direction axis. Thus, one of the operating regions of two reference potential capacitors becomes positive; the other thereof becomes negative. Either of the reference potential capacitors is selected so that the operation region coincides with the operation region of the memory capacitor from which data is read. For this reason, even if the absolute value at the operating point of the memory capacitor varies in positive and negative regions, the absolute value of the reference potential capacitor varies in positive and negative regions, likewise. Therefore, the reference potential can be prevented from largely shifting from the intermediate point between "0" and "1" data read potentials. As a result, this serves to largely take margin regardless of the direction of voltage applied to memory cell capacitor.

(Second Embodiment)

In the second embodiment, reference potential capacitors RC0 and RC1 are connected in parallel. The basic operating principle is the same as in the first embodiment.

Figure 5:
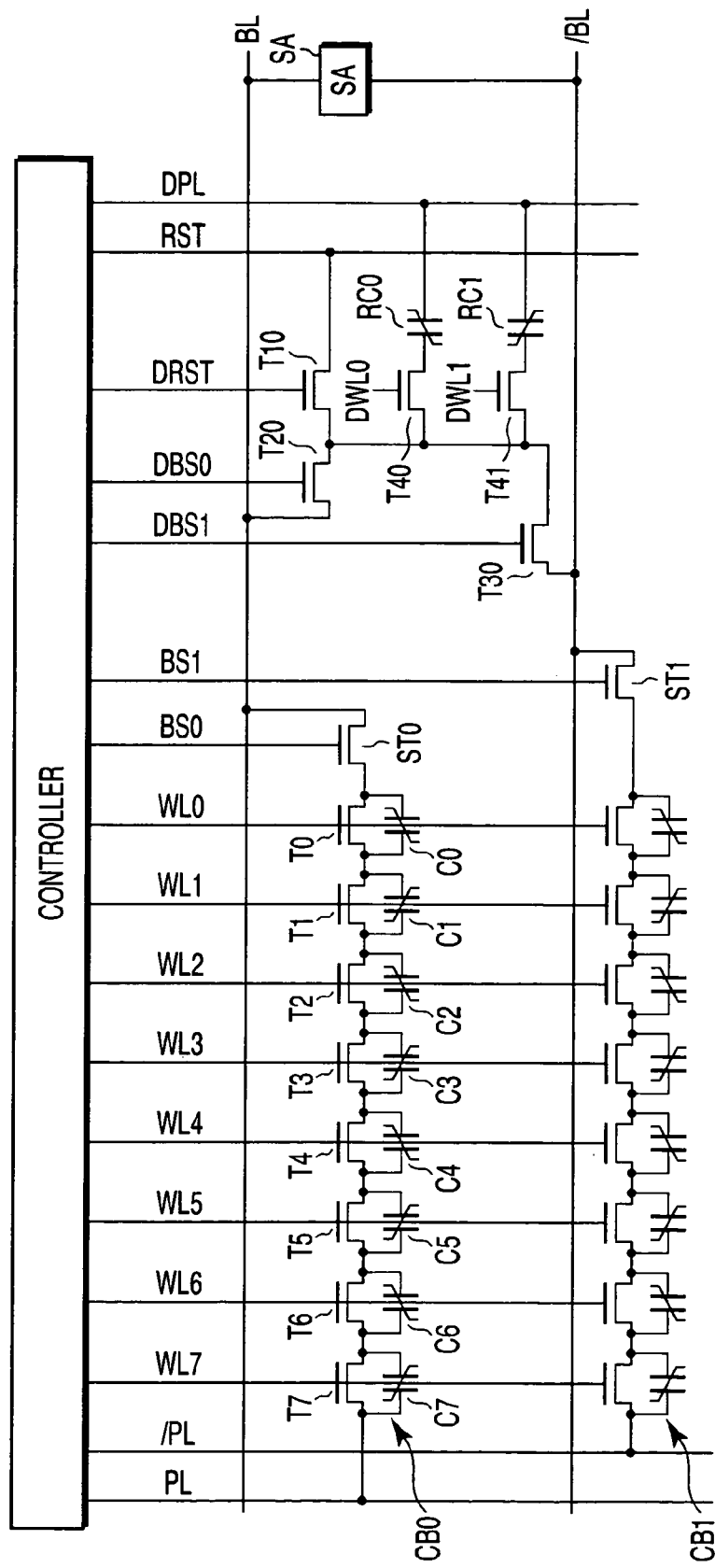
FIG. 5 is a view schematically showing the circuit configuration of a semiconductor memory device according to a second embodiment of the present invention.

FIG. 5 is a view schematically showing the circuit configuration of a semiconductor memory device according to a second embodiment of the present invention. As shown in FIG. 5, the sixth electrode (top electrode) E6 of the reference potential capacitor RC0 is connected with a dummy plate line DPL while the fifth electrode (bottom electrode) E5 thereof is connected with one terminal of a cell select transistor T40. The gate of the cell select transistor T40 is connected with a cell select line DWL0. The other terminal of the cell select transistor T40 is connected with one terminal of individual block select transistors T20 and T30.

The seventh electrode (top electrode) E7 of the reference potential capacitor RC1 is connected with the dummy plate line DPL while the eighth electrode (bottom electrode) E8 thereof is connected with one terminal of a cell select transistor T41. The gate of the cell select transistor T40 is connected with a cell select line DWL1.

The cross-sectional structure of reference potential capacitors RC0 and RC1 is the same as shown in FIG. 2 and FIG. 3. More specifically, the reference potential capacitor RC0 has fifth and sixth electrodes E5 and E6 in that order along the increasing direction of the first direction axis. The reference potential capacitor RC1 has seventh and eighth electrodes E7 and E8 in that order along the same as above. These capacitors and components are connected so that when reading reference potential, voltage is applied to the capacitor RC0 in the decreasing direction of the first direction axis while being applied to the capacitor RC1 in the increasing direction thereof.

Figure 6:
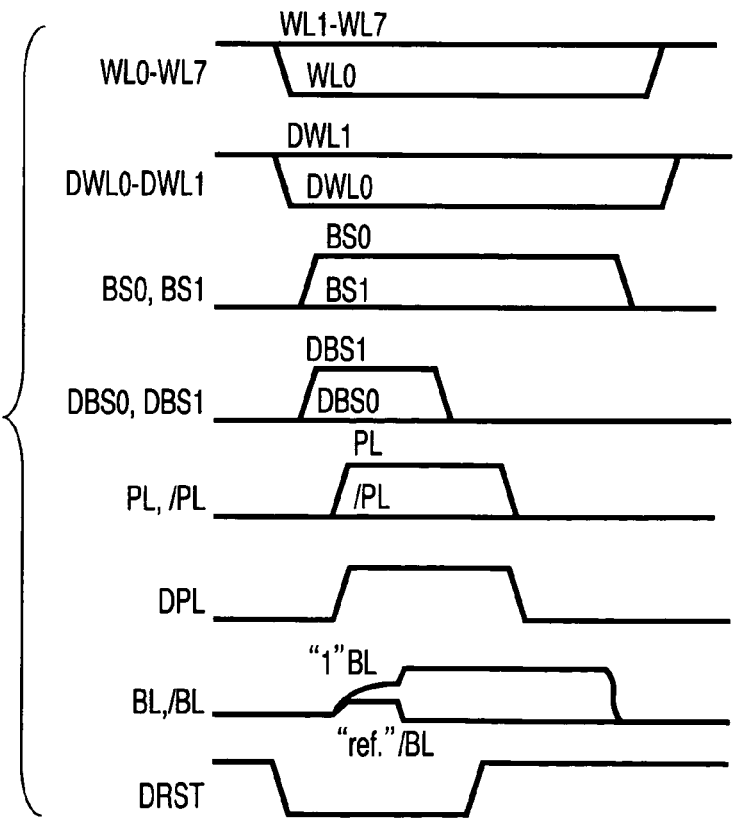
FIG. 6 is a view showing potentials of principal parts of the semiconductor memory device shown in FIG. 5.

FIG. 6 shows potentials of principal parts of the semiconductor memory device of FIG. 5. Here, the case where the data of the memory capacitor C0 of the cell block CB0 is read is given as the example. Bit lines BL and /BL are set to a floating state. As depicted in FIG. 6, the word line WL0 is set to low level, and the cell select line DWL0 is set to low level. Then, the cell block select line BS0 is set to high level. As a result, the cell select line DWL1 is kept at high level.

The block select line DBS1 is set to high level, and thereby, the fifth electrode (top electrode) E5 of the reference potential capacitor RC0 is electrically connected with the bit line BL via cell select transistor T40 and block select transistor T30.

A reset signal line DRST is set to low level. Then, a drive potential VINT is applied to plate lines PL and DPL0. As a result, voltage is applied to both memory capacitor C0 and reference potential capacitor RC0 in a decreasing direction (from the bottom toward the top in FIG. 2, FIG. 12) of the first direction axis. Thus, data (e.g., data "1") is read to the bit line BL, so that reference potential ref can be read to the bit line BL.

After the data read, the block select line DBS1 is set to low level, and the reset signal line DRST is set to high level. The dummy plate line DPL is set to low level while the reset signal line DRST is kept at high level. As a result, data for generating reference potential is written to the reference potential capacitor RC0 like the first embodiment.

The operation of reading the data of the memory capacitor C1 is the same as the cases of reading the data of the memory capacitor C0 in the second embodiment and reading the data of the memory capacitor C1 in the first embodiment.

According to the second embodiment of the present invention, the semiconductor memory device includes memory capacitor and reference potential capacitor, which operate in the same operating region, like the first embodiment. Therefore, the same effect as the first embodiment is obtained.

(Third Embodiment)

In the third embodiment, reference potential capacitors RC0 and RC1 have the TC parallel unit series-connection type structure, like memory capacitors C0 to C7. The basic operating principle is the same as in the first embodiment.

Figure 7:
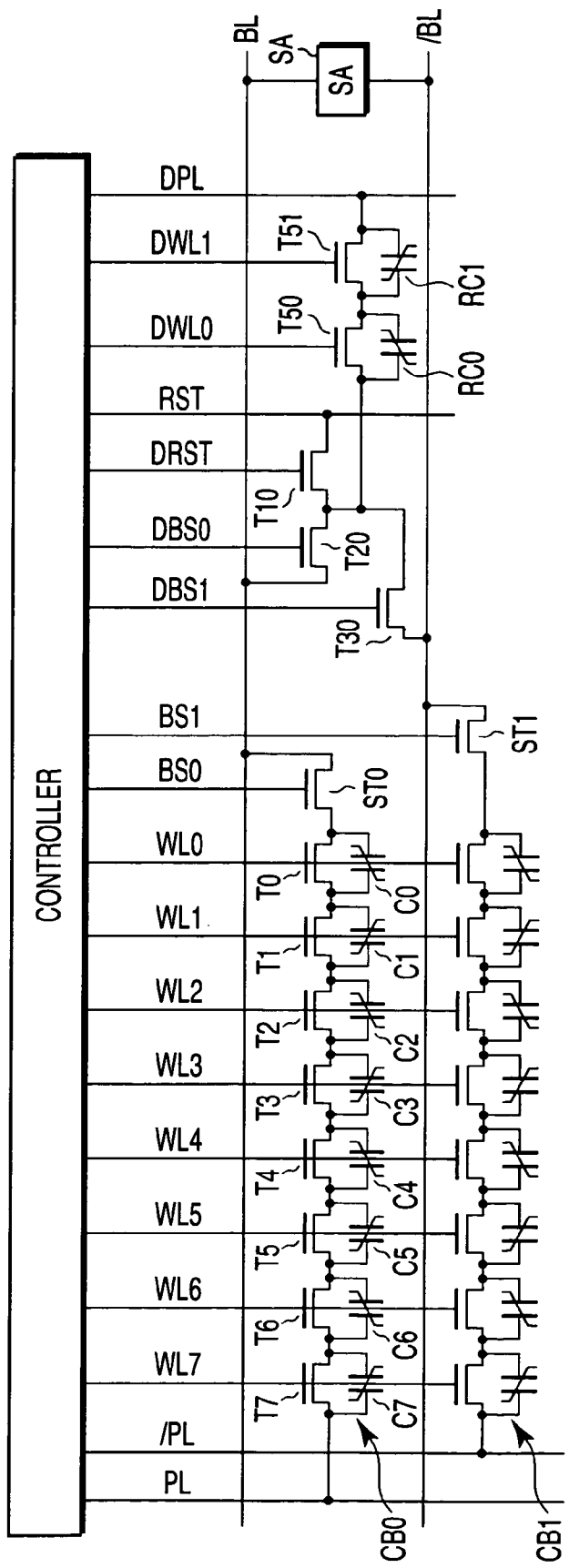
FIG. 7 is a view schematically showing the circuit configuration of a semiconductor memory device according to a third embodiment of the present invention.

FIG. 7 schematically shows the circuit configuration of a semiconductor memory device according to a third embodiment of the present invention. As shown in FIG. 7, both terminals of reference potential capacitors RC0 and RC1 are connected with both terminals of cell select transistors T50 and T51. The seventh electrode (top electrode) E7 of the reference potential capacitor RC1 is connected with the dummy plate line DPL while the eighth electrode (bottom electrode) E8 thereof is connected with the sixth electrode (bottom electrode) E6 of the reference potential capacitor RC0. The fifth electrode (top electrode) E5 of the reference potential capacitor RC0 is connected with one terminal of individual block select transistors T20 and T30.

Figure 8:
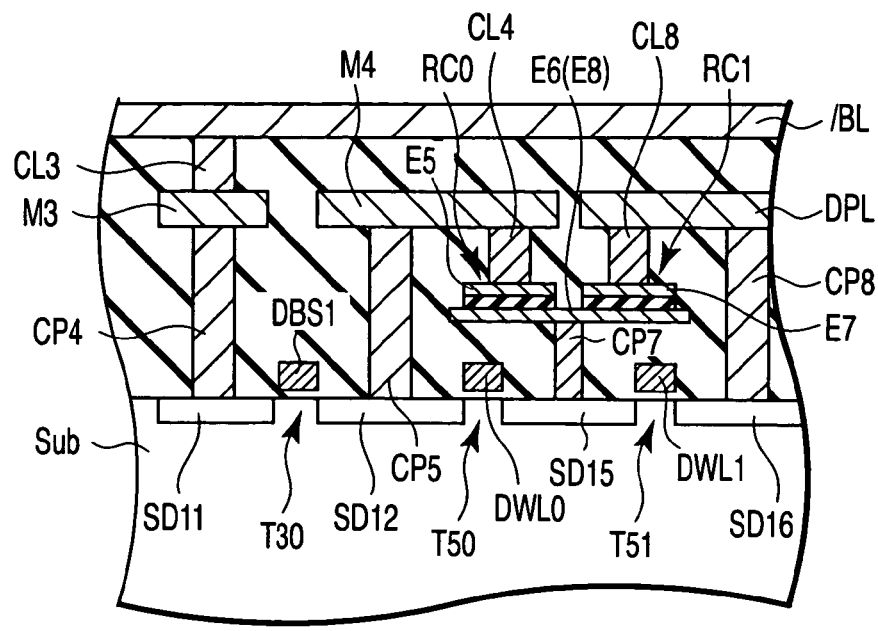
FIG. 8 is a view schematically showing the cross-sectional structure of reference potential capacitors RC0 and RC1.

FIG. 8 schematically shows the cross-sectional structure of reference potential capacitors RC0 and RC1 shown in FIG. 7. Source/drain diffusion layer SD15 constituting part of the cell select transistor T50 is electrically connected with the sixth electrode E6 of the reference potential capacitor RC0 via a contact CP7. The eighth electrode E8 of the reference potential capacitor RC1 is common to the sixth electrode. The seventh electrode E7 of the reference potential capacitor RC1 is connected with a dummy plate line DPL via a connection layer CL8. The dummy plate line DPL is electrically connected with source/drain diffusion layer SD16 constituting part of the cell select transistor T51 via contact CP8.

Figure 9:
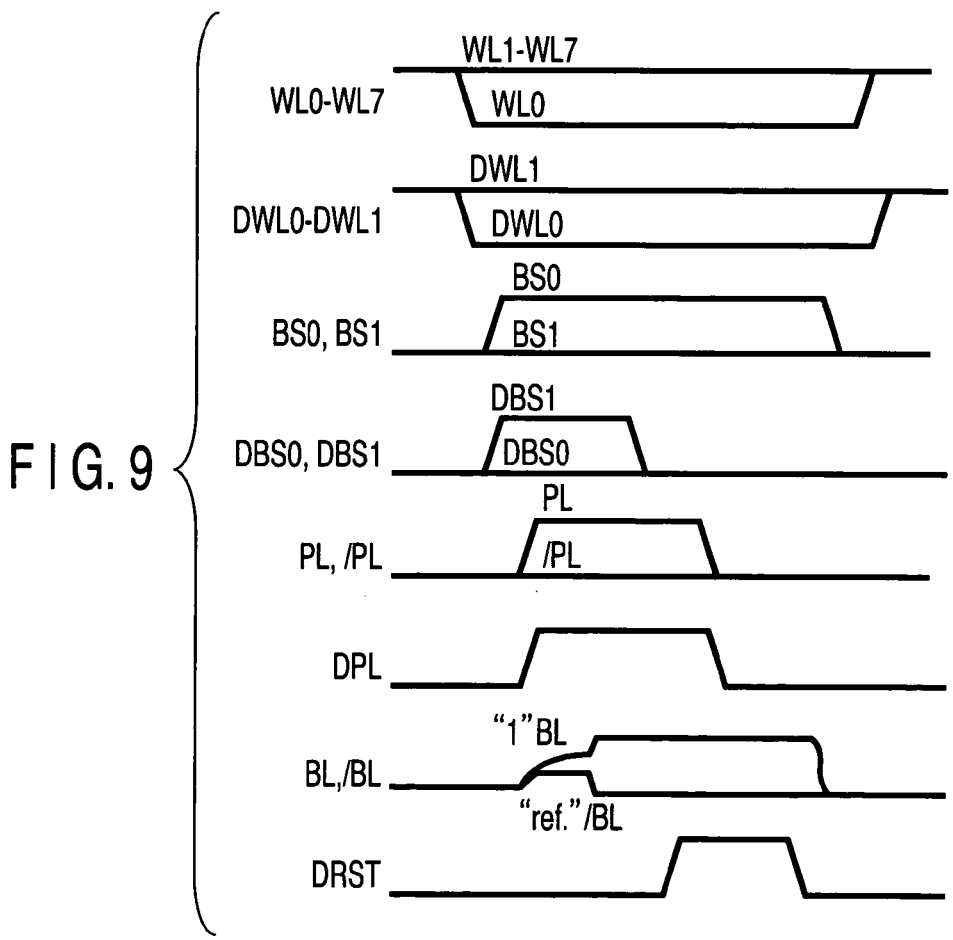
FIG. 9 is a view showing potentials of principal parts of the semiconductor memory device shown in FIG. 7.

FIG. 9 shows potentials of principal parts of the semiconductor memory device of FIG. 7. Here, the case where the data of the memory capacitor C0 of the cell block CB0 is read is given as the example. Bit lines BL and /BL are set to a floating state. As depicted in FIG. 9, the word line WL0 is set to low level, and the cell select line DWL0 is set to low level. Then, the cell block select line BS0 is set to high level. Cell select line DWL1 and cell block select line BS1 are kept at high level.

The block select line DBS1 is set to high level, and thereby, the fifth electrode (top electrode) E5 of the reference potential capacitor RC0 is electrically connected with the bit line BL via the block select transistor T30. On the other hand, the sixth electrode (top electrode) E6 is electrically connected with a dummy bit line DPL via the cell select transistor T51.

A reset signal line DRST is set to low level. Then, a drive potential VINT is applied to plate lines PL and DPL. As a result, voltage is applied to both memory capacitor C0 and reference potential capacitor RC0 in a decreasing direction (from the bottom toward the top in FIG. 8, FIG. 12) of the first direction axis. Thus, data (e.g., data "1") is read to the bit line BL, so that reference potential ref can be read to the bit line BL.

After the data read, the block select line DBS1 is set to low level, and the reset signal line DRST is set to high level. The dummy plate line DPL is set to low level while the reset signal line DRST is kept at high level. As a result, data for generating reference potential is written to the reference potential capacitor RC0 like the first embodiment.

The operation of reading the data of the memory capacitor C1 is the same as the cases of reading the data of the memory capacitor C0 in the third embodiment and reading the data of the memory capacitor C1 in the first embodiment.

According to the third embodiment of the present invention, the semiconductor memory device includes memory capacitor and reference potential capacitor, which operate in the same operating region, like the first embodiment. Therefore, the same effect as the first embodiment is obtained.

(Fourth Embodiment)

In the fourth embodiment, positive or negative voltage is selectively applied to one reference potential capacitor RC0. By doing so, the reference potential capacitor RC0 is operated in the same operating region as the memory cell from which data is read. The basic operating principle is the same as in the first embodiment.

FIG. 10 schematically shows the circuit configuration of a semiconductor memory device according to a fourth embodiment of the present invention. As shown in FIG. 10, the dummy plate line DPL1 is connected with one terminal of a reset transistor T60. The gate of the reset transistor T60 is connected with the reset signal line DRST0. The other terminal of the reset transistor T60 is connected with one terminal of individual block select transistors T70 and T80. The gates of the block select transistors T70 and T80 are individually connected with block select lines DBS0 and DBS1. The other terminals of the block select transistors T70 and T80 are individually connected with bit lines BL and /BL. In addition, the other terminal of the reset transistor T60 is connected with the fifth electrode (top electrode) E5 of the reference potential capacitor RC0.

The dummy plate line DPL0 is connected with one terminal of a reset transistor T61. The gate of the reset transistor T61 is connected with the reset signal line DRST1. The other terminal of the reset transistor T61 is connected with one terminal of individual block select transistors T71 and T81. The gates of the block select transistors T71 and T81 are individually connected with block select lines DBS2 and DBS3. The other terminals of the block select transistors T71 and T81 are individually connected with bit lines BL and /BL. In addition, the other terminal of the reset transistor T61 is connected with the sixth electrode (bottom electrode) E6 of the reference potential capacitor RC0.

Figure 11:
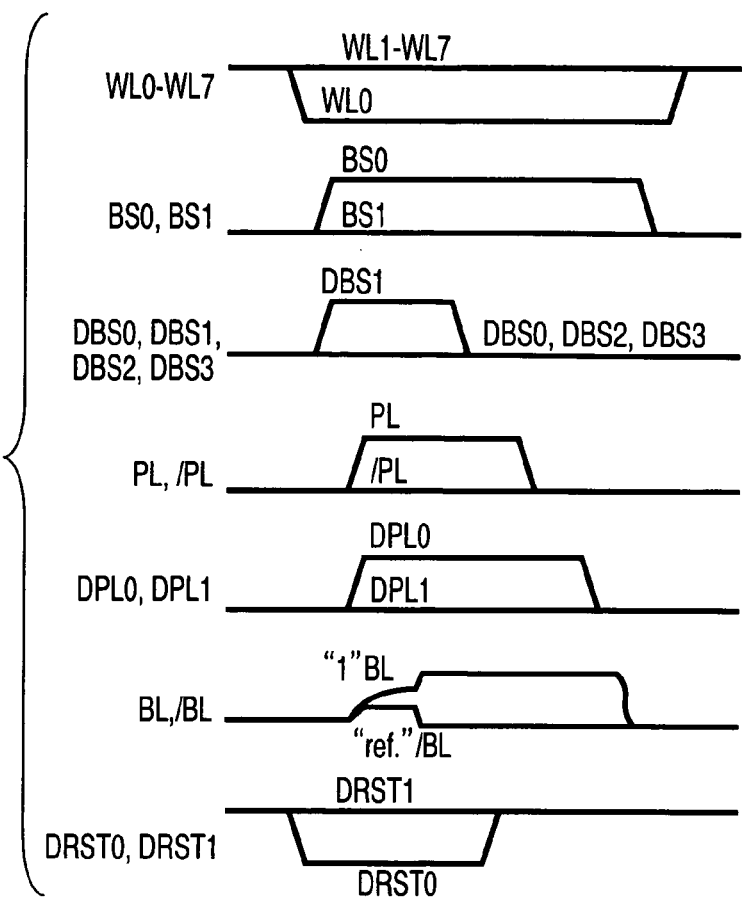
FIG. 11 is a view showing potentials of principal parts of the semiconductor memory device shown in FIG. 10.

FIG. 11 shows potentials of principal parts of the semiconductor memory device of FIG. 10. Here, the case where the data of the memory capacitor C0 of the cell block CB0 is read is given as the example. Bit lines BL and /BL are set to a floating state. As depicted in FIG. 11, the word line WL0 is set to low level, and the cell block select line BS0 is set to high level.

The block select line DBS0 is set to high level, and the reset signal line DRST0 is set to low level in a state that the reset signal line DRST1 is kept at high level. As a result, the fifth electrode (top electrode) E5 of the reference potential capacitor RC0 is electrically connected with the bit line /BL. On the other hand, the sixth electrode (bottom electrode) E6 is electrically connected with the dummy plate line DPL0. Block select lines DBS0, DBS2 and DBS3 are kept at low level.

A drive potential VINT is applied to plate lines PL and dummy plate line DPL0. As a result, voltage is applied to both memory capacitor C0 and reference potential capacitor RC0 in a decreasing direction of the first direction axis. Thus, data (e.g., data "1") is read to the bit line BL, so that reference potential ref can be read to the bit line BL.

After the data read, the block select line DBS1 is set to low level, and the reset signal line DRST is set to high level. The dummy plate line DPL1 is set to low level while the reset signal line DRST0 is kept at high level. As a result, data for generating reference potential is written to the reference potential capacitor RC0 like the first embodiment.

When data is read from the memory capacitor C1, the block select line DBS3 is set to high level, and the reset signal line DRST1 is set to low level in a state that the reset signal line DRST0 is kept at high level. As a result, the fifth electrode (top electrode) E5 of the reference potential capacitor RC0 is electrically connected with the dummy plate line DPL0. On the other hand, the sixth electrode (top electrode) E6 is electrically connected with the bit line BL. Block select lines DBS0, DBS1 and DBS2 are kept at low level.

A drive potential VINT is applied to plate lines PL and dummy plate line DPL1. As a result, voltage is applied to both memory capacitor C0 and reference potential capacitor RC0 in an increasing direction of the first direction axis. Thus, data (e.g., data "1") is read to the bit line BL, so that reference potential ref can be read to the bit line BL.

According to the fourth embodiment of the present invention, the semiconductor memory device includes memory capacitor and reference potential capacitor, which operate in the same operating region, like the first embodiment. Therefore, the same effect as the first embodiment is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first bit line and a second bit line constituting a bit line pair;
   a first ferroelectric capacitor having a first electrode and a second electrode provided below the first electrode, the first electrode being selectively electrically connected to the first bit line and the second electrode being selectively provided with a drive potential;
   a second ferroelectric capacitor having a third electrode and a fourth electrode provided below the third electrode, the third electrode being selectively provided with the drive potential and the fourth electrode being selectively electrically connected to the first bit line;
   a third ferroelectric capacitor having a fifth electrode and a sixth electrode provided below the fifth electrode, the fifth electrode being selectively electrically connected to the first bit line or the second bit line and the sixth electrode being selectively provided with the drive potential;
   a fourth ferroelectric capacitor having a seventh electrode and an eighth electrode provided below the seventh electrode, the seventh electrode being selectively provided with the drive potential and the eighth electrode being selectively electrically connected to the first bit line or the second bit line; and
   a sense amplifier amplifying the potential difference between the first bit line and the second bit line.

2. The device according to claim 1, further comprising:
   a first plate line which is selectively electrically connected with the second electrode and is selectively electrically connected with the third electrode;
   a second plate line electrically connected with the sixth electrode; and
   a third plate line electrically connected with the seventh electrode.

3. The device according to claim 2, wherein the first plate line, the second plate line and the third plate line are provided with the drive potential.

4. The device according to claim 2, further comprising a first block select transistor having a source and a drain, one of which is electrically connected with the second bit line, and another one of which is electrically connected with the fifth electrode.

5. The device according to claim 4, further comprising a second block select transistor having a source and a drain, one of which is electrically connected with the second bit line, and another one of which is electrically connected with the eighth electrode.

6. The device according to claim 5, further comprising:
   a first potential line supplied with potential for writing reference potential to the third ferroelectric capacitor;
   a first reset transistor having a source and a drain, one of which is electrically connected with the fifth electrode, and another one of which is electrically connected with the first potential line.

7. The device according to claim 6, further comprising:
   a second potential line supplied with potential for writing reference potential to the fourth ferroelectric capacitor; and
   a second reset transistor having a source and a drain, one of which is electrically connected with the eighth electrode, and another one of which is electrically connected with the second potential line.

8. The device according to claim 1, further comprising:
   a first plate line which is selectively electrically connected with the second electrode and is selectively electrically connected with the third electrode; and
   a second plate line electrically connected with the sixth and seventh electrodes.

9. The device according to claim 8, wherein the first plate line and the second plate line are provided with the drive potential.

10. The device according to claim 8, further comprising:
    a block select transistor having a source and a drain, one of which is connected with the second bit line; and
    a first cell select transistor having a source and a drain, one of which is connected with another one of the source and the drain of the block select transistor, and another one of which is connected with the fifth electrode.

11. The device according to claim 10, further comprising a second cell select transistor having a source and a drain, one of which is connected with another one of the source and the drain of the block select transistor, and another one of which is connected with the eighth electrode.

12. The device according to claim 10, further comprising:
    a potential line supplied with potential for writing reference potential to the third and fourth ferroelectric capacitors; and
    a reset transistor having a source and a drain, one of which is electrically connected with the fifth and eighth electrodes, and another one of which is electrically connected with the potential line.

13. The device according to claim 1, further comprising:
    a first plate line which is selectively electrically connected with the second electrode and is selectively electrically connected with the third electrode; and
    a second plate line electrically connected with the seventh electrode.

14. The device according to claim 13, wherein the first plate line and the second plate line are provided with the drive potential.

15. The device according to claim 13, further comprising:
    a block select transistor having a source and a drain, one of which is electrically connected with the second bit line, and another one of which is electrically connected with the fifth electrode.

16. The device according to claim 15, further comprising:
    a first cell select transistor having a source and a drain, one of which is electrically connected with the fifth electrode, and another one of which is electrically connected with the sixth electrode; and
    a second cell select transistor having a source and a drain, one of which is electrically connected with the sixth and eighth electrodes, and another one of which is electrically connected with the seventh electrode.

17. The device according to claim 16, further comprising:
    a potential line supplied with potential for writing reference potential to the third or fourth ferroelectric capacitor; and a reset transistor having a source and a drain, one of which is electrically connected with the fifth electrode, and another one of which is connected with the potential line.

18. The device according to claim 1, further comprising:
a first cell transistor having a source and a drain, one of which is connected with the first electrode, and another one of which is connected with the second electrode; and
a second cell transistor having a source and a drain, one of which is connected with the third electrode, and another one of which is connected with the fourth electrode.

19. The device according to claim 18, further comprising:
first memory cells each being composed of the first ferroelectric capacitor and the first cell transistor; and
second memory cells each being composed of the second ferroelectric capacitor and the second cell transistor,
said first and second memory cells being successively and alternately connected in series.

20. The device according to claim 1, wherein the first to fourth ferroelectric films are derived from substantially a same film,
the first, third, fifth and seventh electrodes are derived from substantially a same film, and
the second, fourth, sixth and eighth electrodes are derived from substantially a same film.

21. A semiconductor memory device comprising:
a first bit line and a second bit line constituting a bit line pair;
a first ferroelectric capacitor having a first electrode and a second electrode provided below the first electrode, the first electrode being selectively electrically connected to the first bit line and the second electrode being selectively provided with a drive potential;
a second ferroelectric capacitor having a third electrode and a fourth electrode provided below the third electrode, the third electrode being selectively provided with the drive potential and the fourth electrode being selectively electrically connected to the first bit line;
a third ferroelectric capacitor having a fifth electrode and a sixth electrode provided below the fifth electrode, the fifth electrode being electrically connected to the second bit line while the sixth electrode being provided with a drive potential or the fifth electrode being provided with the drive potential while the sixth electrode being electrically connected to the second bit line; and
a sense amplifier amplifying the potential difference between the first and second bit lines.

22. The device according to claim 21, further comprising:
a first plate line which is selectively electrically connected with the second electrode and is selectively electrically connected with the third electrode;
a second plate line electrically connected with the fifth electrode; and
a third plate line electrically connected with the sixth electrode.

23. The device according to claim 22, wherein the first plate line, the second plate line and the third plate line are provided with the drive potential.

24. The device according to claim 22, further comprising:
a first block select transistor having a source and a drain, one of which is electrically connected with the second bit line, and another one of which is electrically connected with the fifth electrode.

25. The device according to claim 24, further comprising:
a second block select transistor having a source and a drain, one of which is electrically connected with the second bit line, and another one of which is electrically connected with the sixth electrode.

26. The device according to claim 25, further comprising:
a first reset transistor having a source and a drain, one of which is electrically connected with the fifth electrode, and another one of which is electrically connected with the second plate line.

27. The device according to claim 26, further comprising:
a first reset transistor having a source and a drain, one of which is electrically connected with the sixth electrode, and another one of which is electrically connected with the third plate line.

28. The device according to claim 21, further comprising:
a first cell transistor having a source and a drain, one of which is connected with the first electrode, and another one of which is connected with the second electrode; and
a second cell transistor having a source and a drain, one of which is connected with the third electrode, and another one of which is connected with the fourth electrode.

29. The device according to claim 28, further comprising:
first memory cells each being composed of the first ferroelectric capacitor and the first cell transistor; and
second memory cells each being composed of the second ferroelectric capacitor and the second cell transistor,
said first and second memory cells being successively and alternately connected in series.

30. The device according to claim 21, wherein
the first to fourth ferroelectric films are derived from substantially a same film,
the first, third, fifth and seventh electrodes are derived from substantially a same film, and
the second, fourth, sixth and eighth electrodes are derived from substantially a same film.

* * * * *